(12) United States Patent
Han et al.

(10) Patent No.: US 10,790,140 B2
(45) Date of Patent: Sep. 29, 2020

(54) HIGH DEPOSITION RATE AND HIGH QUALITY NITRIDE

(71) Applicant: Applied Materials, Inc., Santa Clara, CA (US)

(72) Inventors: Xinhai Han, Santa Clara, CA (US); Deenesh Padhi, Sunnyvale, CA (US); Masaki Ogata, San Jose, CA (US); Yinan Zhang, Fremont, CA (US); Shaunak Mukherjee, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/889,744

(22) Filed: Feb. 6, 2018

(65) Prior Publication Data

US 2018/0233356 A1 Aug. 16, 2018

Related U.S. Application Data

(60) Provisional application No. 62/458,867, filed on Feb. 14, 2017.

(51) Int. Cl.
| | |
|---|---|
| *H01L 21/02* | (2006.01) |
| *H01J 37/32* | (2006.01) |
| *H01L 27/115* | (2017.01) |
| *H01L 27/11556* | (2017.01) |
| *H01L 27/11582* | (2017.01) |

(52) U.S. Cl.
CPC .. *H01L 21/02274* (2013.01); *H01J 37/32082* (2013.01); *H01L 21/022* (2013.01); *H01L 21/0217* (2013.01); *H01L 21/0228* (2013.01); *H01L 21/02164* (2013.01); *H01L 21/02216* (2013.01); *H01L 21/02219* (2013.01); *H01L 27/115* (2013.01); *H01J 2237/3321* (2013.01); *H01L 27/11556* (2013.01); *H01L 27/11582* (2013.01)

(58) Field of Classification Search
CPC ......... H01L 21/02274; H01L 21/02164; H01L 21/02219; H01J 37/32082
See application file for complete search history.

(56) References Cited

U.S. PATENT DOCUMENTS

| | | | |
|---|---|---|---|
| 7,192,626 B2 | 3/2007 | Dussarrat et al. | |
| 7,473,655 B2 | 1/2009 | Wang et al. | |

(Continued)

*Primary Examiner* — Joseph C. Nicely
(74) *Attorney, Agent, or Firm* — Patterson + Sheridan, LLP

(57) ABSTRACT

In one implementation, a method comprising depositing one or more silicon oxide/silicon nitride containing stacks on a substrate positioned in a processing chamber is provided. Depositing the one or more silicon oxide/silicon nitride containing stacks comprises (a) energizing a first process gas into a first plasma, (b) depositing a first film layer over the substrate from the first plasma, (c) energizing a second process gas into a second plasma, wherein the second process gas comprises a compound having at least one silicon-nitrogen bond and (d) depositing a second film layer on the first film layer from the second plasma. The method further comprises repeating (a), (b), (c), and (d) until a predetermined number of first film layers and second film layers have been deposited on the substrate. The first film layer is a silicon oxide layer and the second film layer is a silicon nitride layer.

20 Claims, 5 Drawing Sheets

(56) References Cited

U.S. PATENT DOCUMENTS

| | | |
|---|---|---|
| 8,889,566 B2 | 11/2014 | Chatterjee et al. |
| 2005/0170104 A1* | 8/2005 | Jung .................... C23C 16/345 427/569 |
| 2006/0099725 A1* | 5/2006 | Shioya ................. C23C 16/401 438/9 |
| 2011/0073162 A1* | 3/2011 | Kikuchi ........... H01L 31/02168 136/246 |
| 2011/0136347 A1 | 6/2011 | Kovarsky et al. |
| 2012/0040536 A1* | 2/2012 | Furuta ................ H01L 21/0217 438/791 |
| 2012/0142198 A1 | 6/2012 | Wang et al. |
| 2013/0306758 A1* | 11/2013 | Park ..................... C23C 16/345 239/418 |
| 2014/0118751 A1* | 5/2014 | Rajagopalan ........... H01L 21/00 356/630 |
| 2015/0104954 A1* | 4/2015 | Pore ................... H01L 21/0217 438/778 |
| 2015/0126045 A1* | 5/2015 | Chatterjee .......... H01L 21/0217 438/793 |
| 2015/0203966 A1 | 7/2015 | Budiarto et al. |
| 2015/0279852 A1* | 10/2015 | Mizutani ........... H01L 27/11556 257/315 |
| 2016/0079185 A1* | 3/2016 | Kato ................. H01L 21/76877 257/314 |
| 2016/0160350 A1 | 6/2016 | Ha et al. |
| 2016/0163870 A1* | 6/2016 | Ito ...................... H01L 29/7869 257/43 |
| 2016/0244879 A1* | 8/2016 | Liang ................... C23C 16/401 |
| 2016/0293609 A1* | 10/2016 | Jha .................... H01L 21/0217 |
| 2016/0314961 A1* | 10/2016 | Liu ................... H01L 21/31111 |
| 2016/0322213 A1 | 11/2016 | Thompson et al. |
| 2016/0336174 A1 | 11/2016 | Underwood et al. |
| 2017/0018420 A1* | 1/2017 | Kato .................. H01L 21/0228 |
| 2017/0018477 A1* | 1/2017 | Kato .................. H01L 23/3192 |
| 2017/0148654 A1* | 5/2017 | Paul ..................... G05B 19/041 |
| 2017/0207088 A1* | 7/2017 | Kwon ................ H01L 21/0332 |
| 2017/0323803 A1* | 11/2017 | van Schravendijk ....................... H01L 21/02211 |
| 2018/0040703 A1* | 2/2018 | Chang ............... H01L 29/41791 |
| 2018/0040733 A1* | 2/2018 | Chang ............... H01L 21/76879 |
| 2018/0151373 A1* | 5/2018 | Tsai .................. H01L 21/28088 |

* cited by examiner

HIGH DEPOSITION RATE AND HIGH QUALITY NITRIDE

CROSS-REFERENCE TO RELATED APPLICATIONS

This application claims benefit of U.S. Provisional Patent Application Ser. No. 62/458,867, filed Feb. 14, 2017, which is incorporated herein by reference in its entirety.

BACKGROUND

Field

Implementations of the present disclosure generally relate to thin films incorporating high aspect ratio feature definitions and methods for forming the same.

Description of the Related Art

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three-dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three-dimensional (3D) stacking of semiconductor chips reduces wire lengths and keeps wiring delay low. In manufacturing three-dimensional (3D) stacking of semiconductor chips, stair-like structures are often utilized to allow multiple interconnection structures to be disposed thereon, forming high-density of vertical transistor devices.

Since these three-dimensional stacks contain multiple layers of materials, the amount of time to deposit each layer is key. As the number of layers in these three-dimensional stacks increases, increasing throughput to reduce the cost of ownership is a key component.

Therefore, there is a need for additional methods for increasing throughput for deposition of material layers.

SUMMARY

Implementations of the present disclosure generally relate to thin films incorporating high aspect ratio feature definitions and methods for forming the same. In one implementation, a method is provided. The method comprises depositing one or more silicon oxide/silicon nitride containing stacks on a substrate positioned in a processing chamber and in the presence of a vacuum. Depositing the one or more silicon oxide/silicon nitride containing stacks comprises (a) energizing a first process gas into a first plasma, (b) depositing a first film layer over the substrate from the first plasma, (c) energizing a second process gas into a second plasma, wherein the second process gas comprises a compound having at least one silicon-nitrogen bond and (d) depositing a second film layer on the first film layer from the second plasma. The method further comprises repeating (a), (b), (c), and (d) until a predetermined number of first film layers and second film layers have been deposited on the substrate. The first film layer is a silicon oxide layer and the second film layer is a silicon nitride layer.

In another implementation, a method is provided. The method comprises depositing one or more silicon oxide/silicon nitride containing stacks on a substrate positioned in a processing chamber and in the presence of a vacuum. Depositing the one or more silicon oxide/silicon nitride containing stacks comprises (a) energizing a first process gas into a first plasma, wherein the first plasma is generated by an RF power source at a low-frequency between 0.3 MHz and about 14 MHz, (b) depositing a silicon oxide layer over the substrate from the first plasma, (c) energizing a second process gas into a second plasma, and (d) depositing a silicon nitride layer on the silicon oxide layer from the second plasma. The second process gas comprises a compound having at least one silicon-nitrogen bond and the second plasma is generated by an RF power source at a high frequency between about 25 MHz and about 30 MHz. The method further comprises repeating (a), (b), (c), and (d) until a predetermined number of silicon oxide layers and silicon nitride layers have been deposited on the substrate.

In yet another implementation, a method is provided. The method comprises depositing one or more silicon oxide/silicon nitride containing stacks on a substrate positioned in a processing chamber and in the presence of a vacuum. Depositing the one or more silicon oxide/silicon nitride containing stacks comprises (a) energizing a first process gas into a first plasma, wherein the first plasma is generated by an RF power source at a low-frequency between 0.3 MHz and about 14 MHz, (b) depositing a silicon oxide layer over the substrate from the first plasma, (c) energizing a second process gas into a second plasma, and (d) depositing a silicon nitride layer on the silicon oxide layer from the second plasma. The second process gas comprises a compound having at least one silicon-nitrogen bond and the second plasma is generated by a dual-frequency RF power source that provides a high-frequency power in a range from about 25 MHz and about 30 MHz and a low-frequency power in a range of from about 10 KHz to about 2 MHz. The method further comprises repeating (a), (b), (c), and (d) until a predetermined number of silicon oxide layers and silicon nitride layers have been deposited on the substrate.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
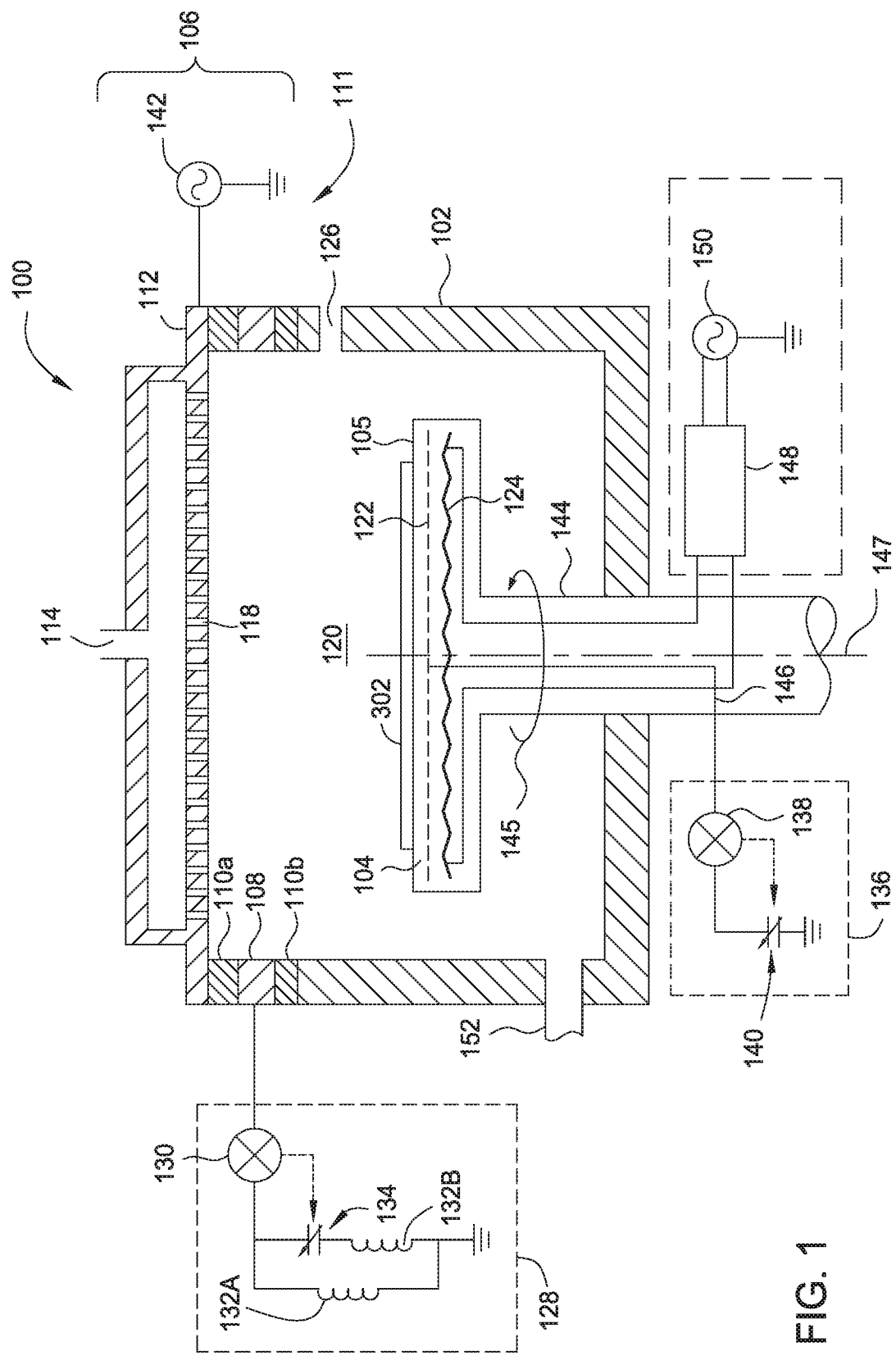
FIG. 1 depicts a schematic side view of a processing chamber that may be utilized to form film layers according to implementations described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes thin films having high aspect ratio features formed therein, processes for the deposition of thin films and formation of high aspect ratio feature therein, and devices for carrying out the aforementioned processes. Certain details are set forth in the following description and in FIGS. 1-3 to provide a thorough understanding of various implementations of the disclosure. Other details describing well-known methods and systems often associated with the deposition of thin films are not set forth in the following disclosure to avoid unnecessarily obscuring the description of the various implementations.

Many of the details, components and other features described herein are merely illustrative of particular implementations. Accordingly, other implementations can have other details, components, and features without departing from the spirit or scope of the present disclosure. In addition, further implementations of the disclosure can be practiced without several of the details described below.

Other deposition chambers may also benefit from the present disclosure and the parameters disclosed herein may vary according to the particular deposition chamber used to form the 3D NAND gate stacks described herein. For example, other deposition chambers may have a larger or smaller volume, requiring gas flow rates that are larger or smaller than those recited for deposition chambers available from Applied Materials, Inc.

Current Flash technology will reach a physical limit at 1× Technology node. Various 3D memory technologies are under evaluation to extend beyond the current 1× nanometer technology node. One of the most popular schemes is vertical gate 3D memory cell technology as this can hold the cost down as the number of memory cell layers increase. Multi-Oxide/Nitride stack are used for vertical gate 3D memory cells. However, the key challenges are: 1) maintaining high throughput to lower the cost of ownership, as cost is one of the keys for memory; 2) how to make high-quality nitride without Si—H bonds in the films, as hydrogen evolution from films during subsequent processes ruins the device; and 3) maintaining good particle performance.

The inventors have successfully addressed the aforementioned issues using an in-situ Oxide/Nitride deposition process that applies any of the following either independently or in combination using PECVD technology. One approach described herein uses precursors, which have existing Si—N bonds with a high bonding energy (e.g., 440 kJ/mol) to provide high deposition rate while producing high-quality silicon nitride films. However, these Si—N containing precursors typically have multiple S—H bonds. Due to very high deposition rate, not all Si—H bonds are broken during the reaction. However, Si—H in the silicon nitride films would make nitride unstable during thermal anneal, and hydrogen evolution may ruin the device. Thus, eliminating Si—H bonds while maintaining a high deposition rate is desirable. In some implementations, this is achieved by increasing plasma density/energy through, for example, plasma frequency modulation. In some implementations, higher RF power is used with a reduced flow of dilution gas. The higher RF power has been found by the inventors to dissociate Si—H bonds more effectively. In some implementations, for example, a higher RF frequency (e.g., 27 MHz) is used to achieve higher plasma density and a lower RF frequency (e.g., 2 MHz or 350 kHz) for more plasma energy is used. Another challenge for these precursors is reaction with moisture, which leads to particle formation during processing. In some implementations, a purge process is implemented for a time period (e.g., >3 seconds) to eliminate any residuals in the gas line, lids, and inside chamber.

FIG. 1 depicts a schematic side view of a processing chamber 100 that may be utilized to form film layers according to implementations described herein. The processing chamber 100 features a chamber body 102, a substrate support 104 disposed inside the chamber body 102, and a lid assembly 106 coupled to the chamber body 102 and enclosing the substrate support 104 in a processing volume 120. A substrate 302 is provided to the processing volume 120 through an opening 126, which may be conventionally sealed for processing using a door. The substrate 302 may be positioned on a surface 105 of the substrate support 104. The substrate support 104 may be rotatable, as indicated by the arrow 145, along an axis 147, where a shaft 144 of the substrate support 104 is located. Alternatively, the substrate support 104 may be lifted up to rotate as necessary during a deposition process.

A plasma profile modulator 111 may be disposed in the processing chamber 100 to control plasma distribution across the substrate 302 disposed on the substrate support 104. The plasma profile modulator 111 includes a first electrode 108 that may be disposed adjacent to the chamber body 102 and separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations. The first electrode 108 may also be a perforated electrode, such as a perforated ring or a mesh electrode. The first electrode 108 may also be a plate electrode, for example a secondary gas distributor.

One or more isolators 110a, 110b (collectively 110), which may be a dielectric material such as a ceramic or metal oxide, for example aluminum oxide and/or aluminum nitride, contacts the first electrode 108 and separates the first electrode 108 electrically and thermally from a gas distributor 112 and from the chamber body 102. The gas distributor 112 has feature openings 118 for admitting process gases into the processing volume 120. The gas distributor 112 may be coupled to a first source of electric power (first electric power source) 142, such as an RF generator, RF power source, DC power, pulsed DC power, and pulsed RF power may also be used. In one implementation, the first source of electric power 142 is an RF power source.

The gas distributor 112 may be a conductive gas distributor or a non-conductive gas distributor. The gas distributor 112 may also be made of conductive and non-conductive components. For example, a body of the gas distributor 112 may be conductive while a faceplate of the gas distributor 112 is non-conductive. The gas distributor 112 may be powered, such as by the first source of electric power 142 as shown in FIG. 1 or the gas distributor 112 may be coupled to ground.

The first electrode 108 may be coupled to a first tuning circuit 128 that controls a ground pathway of the processing chamber 100. The first tuning circuit 128 comprises a first electronic sensor 130 and a first electronic controller 134.

The first electronic controller 134 may be or include a variable capacitor or other circuit element(s). The first tuning circuit 128 may be or include one or more inductors 132. The first tuning circuit 128 may be any circuit that enables variable or controllable impedance under the plasma conditions present in the processing volume 120 during processing. In the implementation of FIG. 1, the first tuning circuit 128 features a first circuit leg and a second circuit leg coupled in parallel between ground and the first electronic sensor 130. The first circuit leg includes a first inductor 132A. The second circuit leg includes a second inductor 132B coupled in series with the first electronic controller 134. The second inductor 132B disposed between the first electronic controller 134 and the node connecting both the first and second circuit legs to the first electronic sensor 130. The first electronic sensor 130 may be a voltage or current sensor and may be coupled to the first electronic controller 134 to afford a degree of closed-loop control of plasma conditions inside the processing volume 120.

A second electrode 122 may be coupled to the substrate support 104. The second electrode 122 may be embedded within the substrate support 104 or coupled to a surface of the substrate support 104. The second electrode 122 may be a plate, a perforated plate, a mesh, a wire screen, or any other distributed arrangement of conductive elements. The second electrode 122 may be a tuning electrode, and may be coupled to a second tuning circuit 136 by a conduit 146, for example a cable having a selected resistance, such as 50 ohms (Ω), disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled to the second electronic controller 140 to provide further control over plasma conditions in the processing volume 120.

A third electrode 124, which may be a bias electrode and/or an electrostatic chucking electrode, may be coupled to the substrate support 104. The third electrode may be coupled to a second source of electric power (second electric power source) 150 through a filter 148, which may be an impedance matching circuit. The second source of electric power 150 may be DC power, pulsed DC power, RF bias power, pulsed RF source or bias power, or a combination thereof. In one implementation, the second source of electric power 150 is a RF bias power.

The lid assembly 106 and substrate support 104 of FIG. 1 may be used with any processing chamber for plasma or thermal processing. One example of a plasma-processing chamber with which the lid assembly 106 and substrate support 104 may be beneficially used is the PRODUCER® or PRECISION® platform and chambers available from Applied Materials, Inc., located in Santa Clara, Calif. Chambers from other manufacturers may also be used with the components described above.

In operation, the processing chamber 100 affords real-time control of plasma conditions in the processing volume 120. The substrate 302 is disposed on the substrate support 104, and process gases are flowed through the lid assembly 106 using an inlet 114 according to any chosen flow plan. Gases exit the processing chamber 100 through an outlet 152. Electric power is coupled to the gas distributor 112 to establish a plasma in the processing volume 120. The substrate may be subjected to an electrical bias using the third electrode 124.

Upon energizing a plasma in the processing volume 120, a potential difference is established between the plasma and the first electrode 108. A potential difference is also established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In implementation where the electronic controllers are both variable capacitors, the electronic sensors may adjust the variable capacitors to maximize deposition rate and minimize thickness non-uniformity independently.

Each of the tuning circuits 128, 136 has a variable impedance that may be adjusted using the respective electronic controllers 134, 140. Where the electronic controllers 134, 140 are variable capacitors, the capacitance range of each of the variable capacitors and the inductances of the first inductor 132A and the second inductor 132B are chosen to provide an impedance range, depending on the frequency and voltage characteristics of the plasma that has a minimum in the capacitance range of each variable capacitor. Thus, when the capacitance of the first electronic controller 134 is at a minimum or maximum, impedance of the first tuning circuit 128 is high, resulting in a plasma shape that has a minimum aerial (lateral) coverage over the substrate support. When the capacitance of the first electronic controller 134 approaches a value that minimizes the impedance of the first tuning circuit 128, the aerial coverage of the plasma grows to a maximum, effectively covering the entire working area of the substrate support 104. As the capacitance of the first electronic controller 134 deviates from the minimum impedance setting, the plasma shape shrinks from the chamber walls and aerial coverage of the substrate support declines. The second electronic controller 140 has a similar effect, increasing and decreasing aerial coverage of the plasma over the substrate support as the capacitance of the second electronic controller 140 is changed.

The electronic sensors 130, 138 may be used to tune the respective tuning circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. In this way, a plasma shape can be selected and dynamically controlled during processing. It should be noted that, while the foregoing discussion is based on electronic controllers 134, 140 that are variable capacitors, any electronic component with adjustable characteristic may be used to provide tuning circuits 128 and 136 with adjustable impedance.

Figure 2:
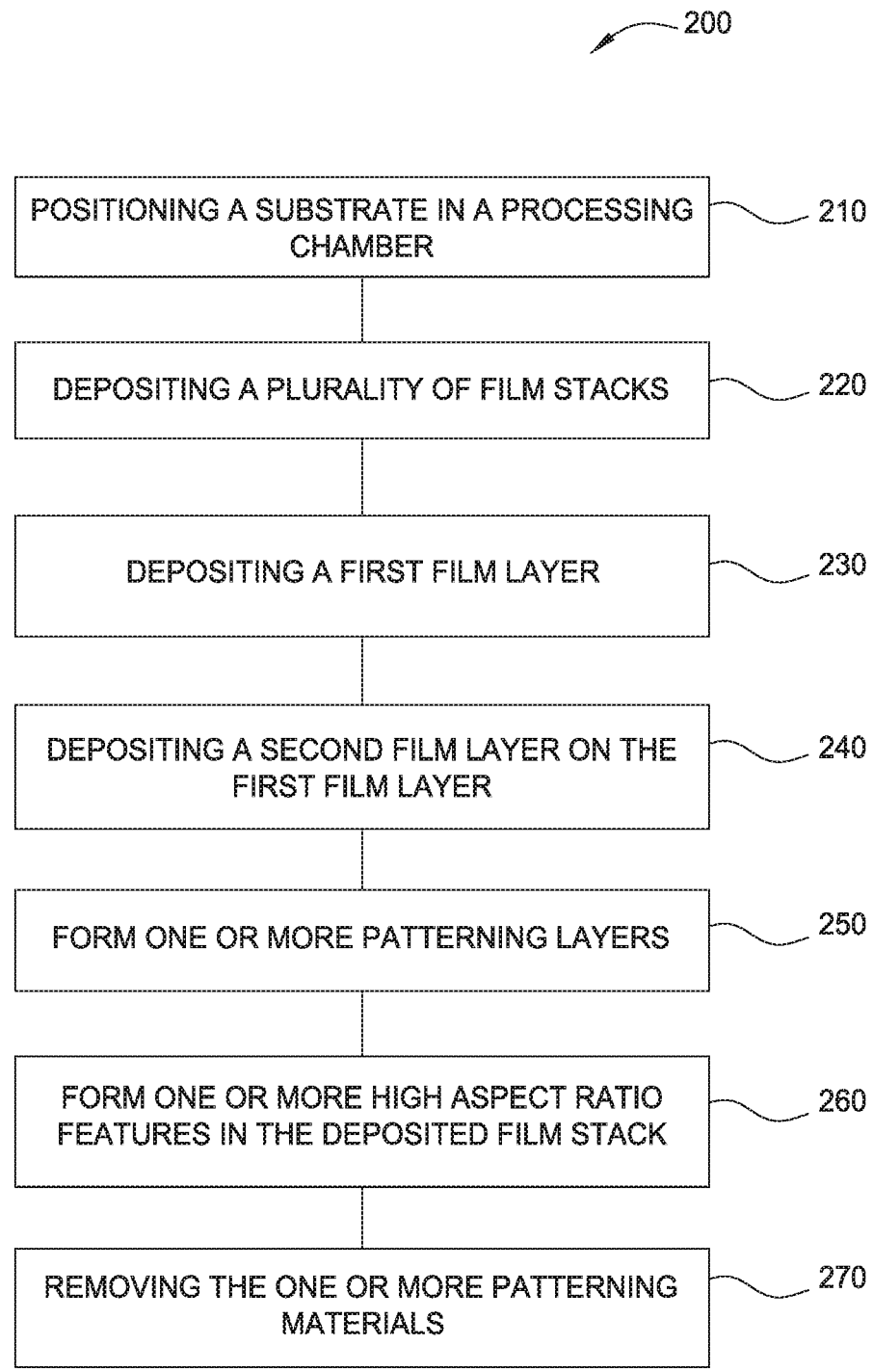
FIG. 2 depicts a flow diagram of a method of forming high aspect ratio feature definitions in thin films according to implementations described herein.

FIG. 2 depicts a flow diagram of a method 200 of forming high aspect ratio feature definitions in thin films according to implementations described herein. High aspect ratio feature definitions include features with high height to width aspect ratios (the ratio of the height of the bare hole divided by the width of the hole) of at least about 5:1 or more (e.g., an aspect ratio of 6:1 or more, 7:1 or more, 8:1 or more, 9:1 or more, 10:1 or more, 11:1 or more, 12:1, 16:7 or more, or even about 10:1 to about 20:1). Exemplary feature definitions which may be formed using the implementations described herein include vias, trenches, lines, contact holes, through-holes or other feature definitions utilized in a semiconductor, solar, or other electronic devices, such as high ratio contact plugs.

Figure 3A:
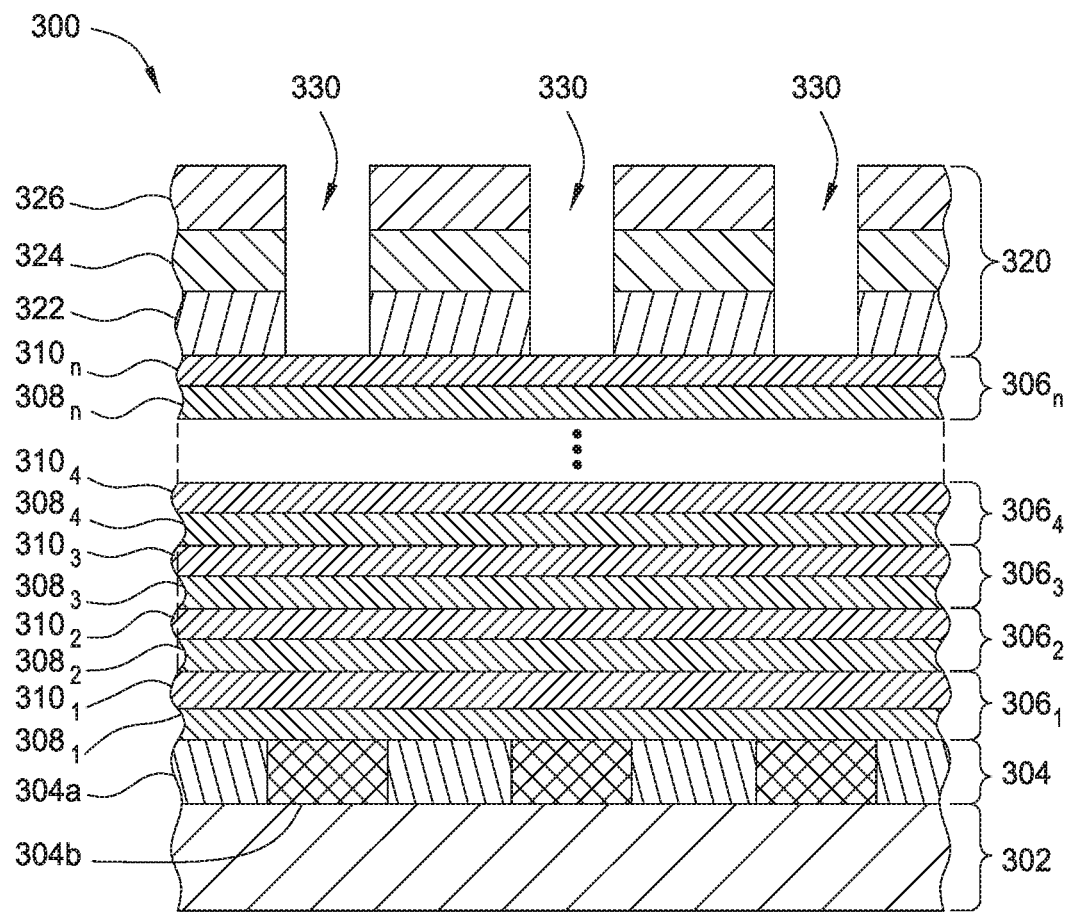
FIGS. 3A-3C depict cross-sectional views of a film structure formed on a substrate utilizing the method depicted in FIG. 2.
Figure 3B:
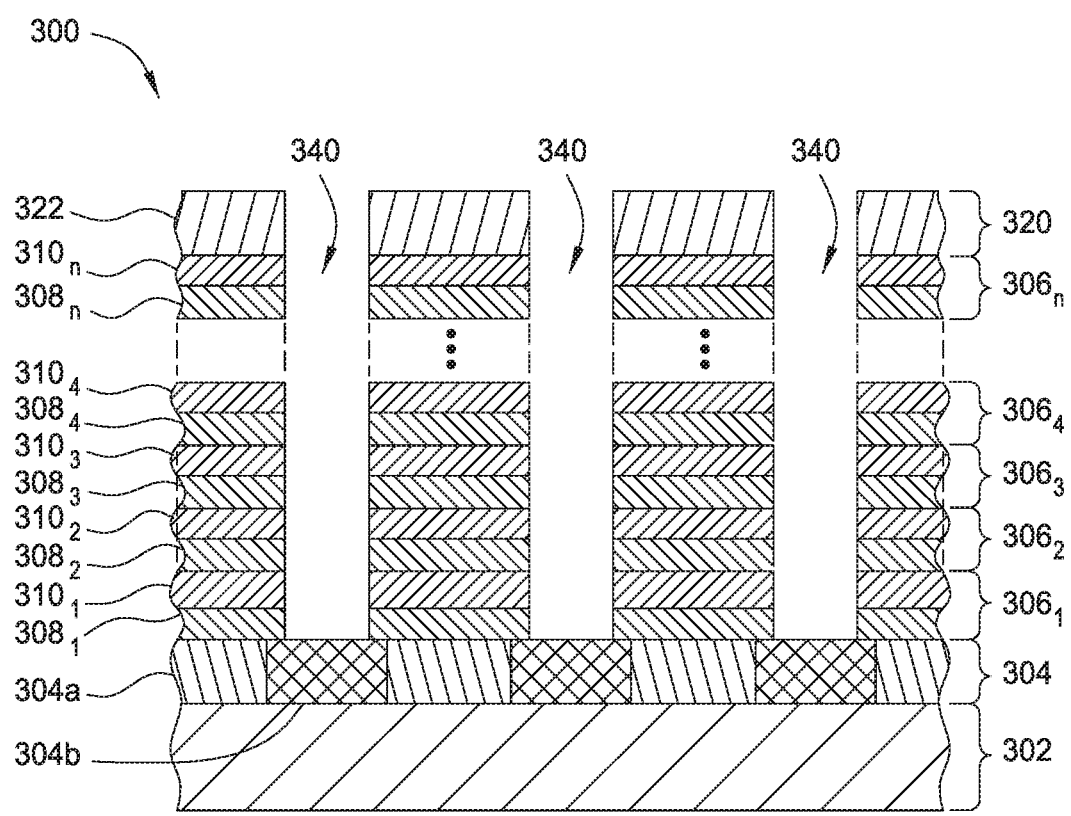
Figure 3C:
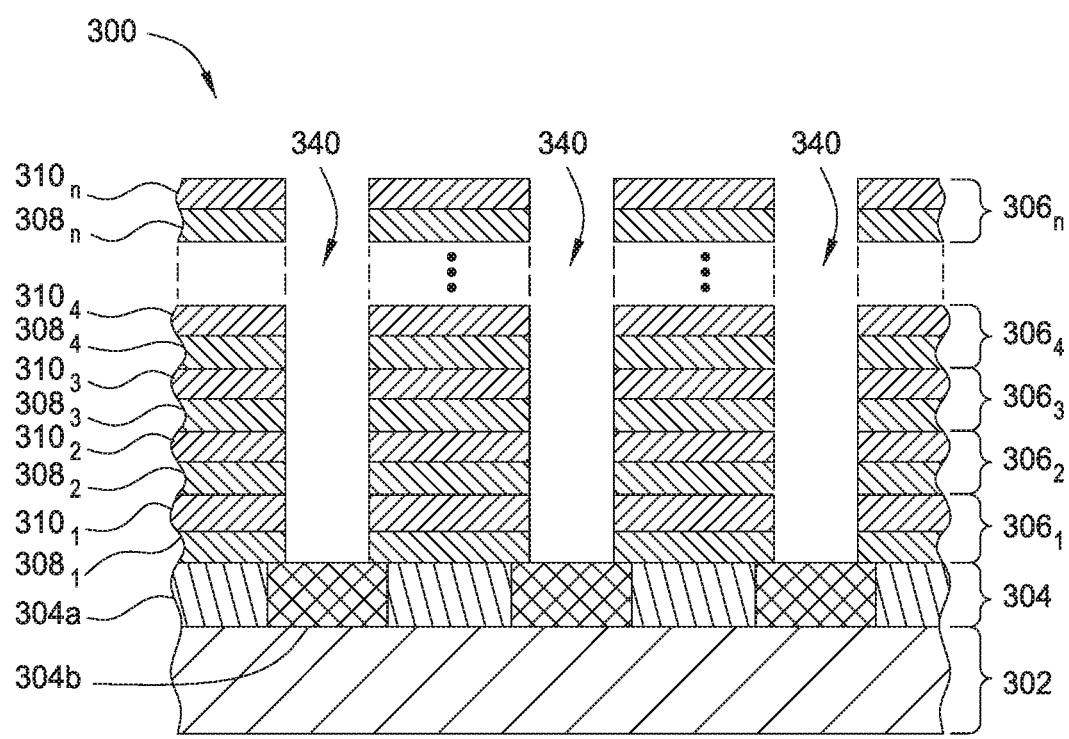

FIGS. 3A-3C depict cross-sectional view of a film structure 300 having high aspect ratios features formed therein on the substrate 302 utilizing the method depicted in FIG. 2A.

In one implementation, the film structure 300 may be utilized to form gate structures for three-dimensional (3D) NAND semiconductor applications. In manufacturing three-dimensional (3D) NAND semiconductor applications, stair-like oxide-nitride pairs of structures are often utilized to high aspect ratio gate stack NAND cells to increase circuit density.

The film structure 300 may be formed on an optional base layer 304 of a substrate 302. The optional base layer 304 may be a patterned layer including a first material 304a and a second material 304b. The film structure 300 has a plurality of material layer stacks $306_1$, $306_2$, $306_3$, $306_4$ ... $306_n$, (collectively 306) formed on the optional base layer 304 sequentially. Each material layer stack 306 may include a first film layer $308_1$, $308_2$, $308_3$, $308_4$ ... $308_n$ (collectively 308) and a second film layer $310_1$, $310_2$, $310_3$, $310_4$ ... $310_n$ (collectively 310) formed thereon so that the film structure 300 includes a plurality of first film layers 308 and second film layers 310 formed in alternation. Various film properties of the films (e.g., refractive index, stress of the film, dopant concentration in the film) may be graded throughout the film structure 300 in order to achieve a more uniform etch profile by compensating for variations in both dry and wet etch rates as feature depth increases. In one implementation the plurality of first film layers 308 are silicon oxide layers and the plurality of second film layers 310 are silicon nitride layers. The plurality of material layer stacks 306 may be formed by PECVD deposition techniques in one processing chamber, such as the processing chamber 100.

In further implementations, the first material layer/second material layer stacks can be silicon/nitride. All of these combinations of materials can be used in Bit-Cost Scalable (BiCS), Terabit Cell Array Transistor (TCAT) and other 3D memory structures. In other implementations, the first material layer/second material layer stack can be other combinations of materials. The deposition order of the first film layers 308 and the second film layers 310 on the substrate 302 can also be reversed.

The number of layers can depend upon the memory device being fabricated. In one embodiment, the stack numbers could be 8×, or 16×, or 24×, or even higher, where each stack of 8, 16, 24, 32, 64, 128 or more layers corresponds to one memory device. The two layers of different materials form each stack, so the corresponding number of layers for an 8× stack number can be 16, a 16× stack number can have 32 layers, a 24× stack number can have 48 layers, and a higher stack number can have a respectively higher number of layers.

The method 200 begins at operation 210 where a substrate, such as the substrate 302 depicted in FIG. 3A, is positioned into a processing chamber, such as the processing chamber 100 depicted in FIG. 1, or other suitable processing chamber. The substrate 302 shown in FIG. 3A includes the optional base layer 304 formed on the substrate 302. In implementations where the optional base layer 304 is not present, the film structure 300 may be formed directly on the surface of the substrate 302. In one implementation, the substrate 302 may have a substantially planar surface, an uneven surface, or a substantially planar surface having a structure formed thereon. The substrate 302 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 302 may have various dimensions, such as 200 mm or 300 mm diameter wafers, as well as, rectangular or square panels. Unless otherwise noted, implementations and examples described herein are conducted on substrates having a 200 mm diameter, a 300 mm diameter, or a 450 mm diameter. In one implementation, the substrate 302 may be a crystalline silicon substrate.

At operation 220, a first material layer stack $306_1$ is formed on the substrate 302. The first material layer stack $306_1$ includes the first film layer $308_1$ and the second film layer $310_1$ formed on the first film layer $308_1$.

At operation 230, the first film layer $308_1$ is formed on the substrate 302. The first film layer $308_1$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the first material layer stack $306_1$ is a silicon oxide-containing layer, such as a silicon oxide layer.

During operation 230, a deposition gas mixture is provided into the processing chamber. The deposition gas mixture may include a silicon-containing gas and a reacting gas. Suitable examples of the silicon-containing gas include, but are not limited to, silane ($SiH_4$), disilane ($Si_2H_6$), silicon tetrafluoride ($SiF_4$), silicon tetrachloride ($SiCl_4$), dichlorosilane ($SiH_2Cl_2$), tetraethyl orthosilicate (TEOS), and the like.

The reacting gas may be an oxygen-containing gas, for forming a silicon oxide-containing layer, a nitrogen-containing gas, for forming a silicon nitride containing layer, or a carbon containing gas, for forming a silicon carbide containing layer. Suitable examples of the oxygen-containing gas include $O_2$, $N_2O$, $NO_2$, $O_3$, $H_2O$ and the like. Suitable examples of the nitrogen-containing gas include $N_2$, $N_2O$, $NO_2$, $NH_3$, $N_2H_2$ and the like. Suitable examples of the carbon containing gas include $CO_2$, CO, $CH_4$, $CF_4$, other suitable carbon based polymer gases and the like.

In one implementation depicted herein, the silicon-containing gas is TEOS and the reacting gas is an oxygen-containing gas such as $N_2O$ to form the first film layer $308_1$, such as a silicon oxide-containing layer, depicted in FIG. 3A.

In one implementation, the gas ratio of the silicon-containing gas, such as the TEOS gas, and reacting gas, such as the oxygen-containing gas ($O_2$, $N_2O$, $NO_2$, $O_3$, and $H_2O$) is maintained to control reaction behavior of the gas mixture, thus allowing a chosen proportion of the oxygen elements in the formed silicon film. In one implementation, the silicon-containing gas (e.g., TEOS gas) may be supplied at a flow rate between about 500 mgm and about 3500 mgm (e.g., between about 500 mgm and about 1000 mgm; between about 1100 mgm and about 2000 mgm; between about 2100 mgm and about 3500 mgm) for a 300 mm substrate and the oxygen-containing gas (e.g., $N_2O$) may be supplied at a flow rate at between about 500 sccm and about 9000 sccm (e.g., between about 500 sccm and about 2500 sccm; between about 3000 sccm and about 6000 sccm; between about 6500 sccm and about 9500 sccm) for a 300 mm substrate. The gas mixture of TEOS gas and $N_2O$ gas may be supplied at a ratio of TEOS to $N_2O$ of between about 1:1 and about 1:150, such as between about 1:1 and about 1:120, for example, about 1:100.

Alternatively, one or more inert gases may be included in the deposition gas mixture provided to the processing chamber 100. The inert gas may include, but not limited to, noble gas, such as Ar, He, and Xe, or $N_2$ and the like. The inert gas may be supplied to the processing chamber 100 at a flow rate at between about 0 sccm and about 5000 sccm (between about 100 sccm and about 1500 sccm; between about 2000 sccm and about 4000 sccm) for a 300 mm substrate. The inert gas may be supplied to the processing chamber 100 at a flow ratio of inert gas to TEOS gas of between about 1:1 and about 1:150. In some implementations, the flow of inert gas may be commenced prior to supplying the flow of the deposition gas into the process chamber.

In one implementation described herein, the silicon-containing gas is TEOS, the reacting gas is an oxygen-containing gas such as $N_2O$ and the inert gas is argon to form the first film layer $308_1$, such as a silicon oxide-containing layer, depicted in FIG. 3A.

Several process parameters are regulated while the deposition gas mixture is supplied into the processing chamber. In one implementation, a pressure of the process gas mixture in the processing chamber is regulated between about 10 mTorr to about 15 Torr, and the substrate temperature is maintained between about 200 degrees Celsius and about 700 degrees Celsius.

During operation 230, while supplying the deposition gas mixture into the processing chamber, an RF source power may be generated by the first source of electric power 142 (depicted in FIG. 1) and coupled to the gas mixture to assist dissociating the deposition gas mixture into reactive species in a plasma. In some implementations, the RF source power may be generated prior to supplying the deposition gas into the process chamber.

The RF source and/or bias power energizes the deposition gas mixture within the processing volume 120 such that the plasma may be sustained. In one implementation, the first source of electric power 142 may be operated to provide RF power at a frequency between 0.3 MHz and about 14 MHz, such as about 13.56 MHz. The first source of electric power 142 may generate RF power at about 10 Watts to about 5000 Watts, (e.g., between about 300 Watts to about 1500 Watts; between about 500 Watts and about 1000 Watts). In some implementations, in addition to the RF source power, the RF bias power provided by the second source of electric power 150 (depicted in FIG. 1) may also be utilized during the deposition process to assist dissociating the deposition gas mixture forming the plasma. In one implementation, the first source of electric power 142 may be operated to provide RF power at a frequency between 0.3 MHz and about 14 MHz, such as about 13.56 MHz. The RF bias power may be supplied at between about 0 Watts and about 1000 Watts (e.g., between about 10 Watts and about 100 Watts) at a frequency of 300 kHz. In one implementation, the RF bias power may be pulsed with a duty cycle between about 10 to about 95 percent at a RF frequency between about 500 Hz and about 10 kHz.

Furthermore, current/voltage may be supplied to the plasma profile modulator 111 to assist controlling profile and distribution of the plasma across the substrate 302. In one implementation, the sidewall tuning electrode current target (e.g., supplied to the first electrode 108) is set to between about 0.5 Amperes and about 40 Amperes, such as about 6 Amperes, and substrate support tuning electrode current target (e.g., supplied to the second electrode 122) is set to between about 0.5 Amperes and about 40 Amperes, such as about 6 Amperes, to assist controlling the plasma as generated in the processing volume 120.

In some implementations during operation 230, a combination of high-frequency RF between about 300 Watts to about 1500 Watts and low-frequency RF between about 0 Watts to about 1000 Watts may be applied during the deposition process.

After a chosen thickness of the first film layer $308_1$ is deposited, the deposition process may then be terminated. In one implementation, the first film layer $308_1$ may have a thickness between about 100 Å and about 600 Å, such as between about 300 Å and about 400 Å. In the implementation wherein the first film layer $308_1$ is a silicon oxide-containing layer, such as a silicon oxide layer, the silicon oxide-containing layer may have a stress range between about 0 MPa and about +1000 MPa.

An optional pump/purge process to pump/purge the residual gases or deposition by-products from the processing chamber may be performed prior to forming the second film layer $310_1$ on the first film layer $308_1$. In some implementations where an inert gas is used during operation 230, the inert gas may be used as the purge gas with or without the application of RF power. In one implementation, the purge gas flows into the processing chamber for 3 or more seconds (e.g., between about 3 seconds and about 10 seconds).

At operation 240, the second film layer $310_1$ is formed on the first film layer $308_1$. The second film layer $310_1$ may be a silicon oxide-containing layer, a silicon nitride-containing layer, a silicon-containing layer, such as amorphous silicon, polycrystalline silicon or any suitable crystalline silicon layers. In the implementation depicted in FIG. 3A, the second film layer $310_1$ is a silicon nitride containing layer, such as a silicon nitride layer.

During operation 240, a second deposition gas mixture is provided into the processing chamber. The second deposition gas mixture includes a silicon and nitrogen-containing gas. In some implementations, the silicon and nitrogen-containing gas is a silylamine-containing precursor. The silicon and nitrogen-containing gas comprises a compound having at least one silicon-nitrogen bond. Suitable examples of the compound having the at least one silicon-nitrogen bond is selected from the group of trisilylamine, disilylamine, silylamine, tridisilylamine, and aminodisilylamine.

The second deposition gas mixture may further include a reacting gas. The reacting gas may be an oxygen-containing gas, for forming a silicon oxide-containing layer, a nitrogen-containing gas, for forming a silicon nitride containing layer, or a carbon-containing gas, for forming a silicon carbide containing layer. Suitable examples of the oxygen-containing gas include $O_2$, $N_2O$, $NO_2$, $O_3$, $H_2O$ and the like. Suitable examples of the nitrogen-containing gas include $N_2$, $N_2O$, $NO_2$, $NH_3$, $N_2H_2$ and the like. Suitable examples of the carbon-containing gas include $CO_2$, CO, $CH_4$, $CF_4$, other suitable carbon based polymer gases and the like.

In one implementation depicted herein, the silylamine-containing precursor is trisilylamine and the reacting gas is a nitrogen-containing gas such as $NH_3$ and $N_2$ to form the second film layer $310_1$, such as a silicon nitride containing layer, as depicted in FIG. 3A.

In one implementation, the gas ratio of the silylamine-containing gas, such as the trisilylamine gas, and reacting gas, such as the nitrogen-containing gas ($N_2$, $N_2O$ or $NH_3$) is maintained to control reaction behavior of the second deposition gas mixture, thus allowing a chosen proportion of the nitrogen elements in the formed silicon film. In one implementation, the silylamine-containing gas (e.g., trisilylamine gas) may be supplied at a flow rate between about 30 sccm and about 400 sccm (e.g., between about 30 sccm and about 100 sccm; between about 150 sccm and about 300 sccm) for a 300 mm substrate and the nitrogen-containing gas (e.g., $NH_3$) may be supplied at a flow rate at between about 200 sccm and about 9000 sccm (e.g., between about 200 sccm and about 7000 sccm; between about 500 sccm and about 2500 sccm; between about 3000 sccm and about 6000 sccm; between about 6500 sccm and about 9500 sccm) for a 300 mm substrate. The second deposition gas mixture of the trisilylamine gas and $NH_3$ gas may be supplied at a ratio of trisilylamine to $NH_3$ of between about 1:1 and about 1:150, such as between about 1:1 and about 1:120, for example, about 1:100.

Alternatively, one or more inert gases may be included in the second deposition gas mixture provided to the processing chamber 100. In some implementations, the inert gas is a mixture of helium and argon. The inert gas may include, but not limited to, noble gas, such as Ar, He, and Xe, or $N_2$ and the like. The inert gas may be supplied to the processing chamber 100 at a flow rate of between about 0 sccm and about 5000 sccm (between about 100 sccm and about 1500 sccm; between about 2000 sccm and about 4000 sccm) for a 300 mm substrate. The inert gas may be supplied to the processing chamber 100 at a flow ratio of inert gas to trisilylamine gas of between about 1:1 and about 1:150. In some implementations, the flow of inert gas may be commenced prior to supplying the flow of the deposition gas into the process chamber.

In one implementation described herein, the silicon-containing gas is trisilylamine, the reacting gas is a nitrogen-containing gas such as $NH_3$ and $N_2$ and the inert gas is argon to form the second film layer $310_1$, such as the silicon nitride-containing layer, depicted in FIG. 3A.

Several process parameters are regulated while the second deposition gas mixture is supplied into the processing chamber. In one implementation, a pressure of the second deposition gas mixture in the processing chamber is regulated between about 10 mTorr to about 15 Torr, and the substrate temperature is maintained between about 200 degrees Celsius and about 700 degrees Celsius.

During operation 240, the spacing between the surface 105 of the substrate support 104 and the gas distributor 112 may be controlled at about 500 mils to about 1,000 mils (e.g., between about 600 mils to about 800 mils; or between about 700 mils and about 800 mils). Not to be bound by theory, but it is believed that the increased space between the surface 105 of the substrate support 104 and the gas distributor 112 provides increased residence time for the processing gases.

During operation 240, while supplying the deposition gas mixture into the processing chamber, an RF source power may be generated by the first source of electric power 142 (depicted in FIG. 1) and coupled to the gas mixture to assist dissociating the deposition gas mixture into reactive species in a plasma. In certain implementations, the silicon and nitrogen containing gas, the reacting gas, and the plasma-initiating gas are introduced into the process chamber and a plasma is initiated to begin deposition.

The RF source and/or bias power energizes the deposition gas mixture within the processing volume 120 such that the plasma may be sustained. In some implementations, a single-frequency RF power application is used, and is typically, an application of the high-frequency power as described herein. In some implementations, a dual-frequency RF power is used to generate the plasma. The applied RF power and use of one or more frequencies may be varied based upon the substrate size and the equipment used.

In one implementation, the first source of electric power 142 may be operated to provide RF source power at a frequency between 15 MHz and about 30 MHz (e.g., between about 25 MHz and about 30 MHz, or about 27 MHz). The first source of electric power 142 may generate RF power at about 10 Watts to about 5000 Watts (e.g., between about 1000 Watts to about 3000 Watts; or between about 1000 Watts and about 1500 Watts). In some implementations, in addition to the RF source power, the RF bias power provided by the second source of electric power 150 (depicted in FIG. 1) may also be utilized during the deposition process to assist dissociating the deposition gas mixture forming the plasma. In one implementation, the first source of electric power 142 may be operated to provide RF bias power at a frequency between 0.3 MHz and about 14 MHz, such as about 13.56 MHz. The RF bias power may be supplied at between about 0 Watts and about 1000 Watts (e.g., between about 10 Watts and about 100 Watts) at a frequency of 300 kHz. In one implementation, the RF bias power may be pulsed with a duty cycle between about 10 to about 95 percent at a RF frequency between about 500 Hz and about 10 kHz.

In some implementations, a dual-frequency RF system is used to generate the plasma. A dual-frequency RF power application is believed to provide independent control of flux and ion energy, since it is believed that the energy of the ions hitting the film surface influences the film density. It is believed that the high-frequency plasma controls plasma density and a low-frequency plasma controls kinetic energy of the ions hitting the substrate surface. A dual-frequency source of mixed RF power provides a high-frequency power in a range from about 10 MHz to about 30 MHz (e.g., between about 15 MHz and about 30 MHz; between about 25 MHz and about 30 MHz; or about 27 MHz), as well as a low-frequency power in a range of from about 10 KHz to about 2 MHz, for example, about 2 MHz or 350 KHz. In some implementations where a dual-frequency RF system is used to deposit the silicon nitride film, the ratio of the second RF power to the total mixed frequency power is less than about 0.6 to 1.0 (0.6:1).

Furthermore, current/voltage may be supplied to the plasma profile modulator 111 to assist controlling profile and distribution of the plasma across the substrate 302. In one implementation, the sidewall tuning electrode current target (e.g., supplied to the first electrode 108) is set to between about 0.5 Amperes and about 40 Amperes, such as about 6 Amperes, and substrate support tuning electrode current target (e.g., supplied to the second electrode 122) is set to between about 0.5 Amperes and about 40 Amperes, such as about 6 Amperes, to assist controlling the plasma as generated in the processing volume 120.

After a chosen thickness of the second film layer $310_1$ is deposited, the deposition process may then be terminated. In one implementation, the second film layer $310_1$ may have a thickness between about 100 Å and about 600 Å, such as between about 300 Å and about 400 Å. In the implementation wherein the second film layer $310_1$ is a silicon nitride containing layer, such as a silicon nitride layer, the silicon nitride containing layer may have a stress range between about 0 MPa and about 1000 MPa.

An optional pump/purge process to pump/purge the residual gases or deposition by-products from the processing chamber after forming the second film layer $310_1$. In some implementations where an inert gas is used during operation 240, the inert gas may be used as the purge gas with or without the application of RF power. In one implementation, the purge gas flows into the processing chamber for three or more seconds (e.g., between about 3 seconds and about 10 seconds).

Operations 230 and 240 of FIG. 2 may be continuously performed to form the first material layer stack $306_1$ with alternating first film layers $308_1$ and second film layers $310_1$ until a chosen thickness of the first material layer stack $306_1$ is achieved. In one implementation, where the first film layer $308_1$ is a silicon oxide layer and the second film layer $310_1$ is a silicon nitride layer, the method 200 of FIG. 2 may be performed by switching different deposition gas mixtures to form the film layers $308_1$, $310_1$ with different compositions without removing the substrate 302 from the processing chamber 100 (e.g., without breaking vacuum).

At operation 250 one or more patterning layers 320 are formed on the film structure 300. The one or more patterning layers may include, for example, a hardmask layer 322 (e.g., amorphous carbon layer), an anti-reflective coating layer 324, and a photoresist layer 326. The one or more patterning layers may be patterned using techniques known in the art to form openings 330. For example, an image of a pattern may be introduced into the photoresist layer 326 using know lithographic techniques. The image of the pattern introduced in the photoresist layer 326, may be developed in an appropriate developer to define the pattern through such layer. Thereafter, the pattern defined in the photoresist layer 326 is transferred through both the anti-reflective coating layer 324 and the hardmask layer 322. The pattern is transferred through both the anti-reflective coating layer 324 and the hardmask layer 322 using the photoresist layer 326 as a mask. The pattern may be transferred through the anti-reflective coating layer 324 using a gas mixture comprising, for example, a hydrogen-containing fluorocarbon ($C_xF_yH_z$) and one or more gases selected from the group consisting of hydrogen ($H_2$), nitrogen ($N_2$), oxygen ($O_2$), argon (Ar), and helium (He). The hardmask layer 322 can be etched using ozone, oxygen, or ammonia plasmas alone or in combination with hydrogen bromide (HBr), nitrogen ($N_2$), carbon tetrafluoride ($CF_4$), argon (Ar), among others.

At operation 260 one or more high aspect ratio features 340 are formed in the film structure 300. The openings 330 defined in the one or more patterning layers 320 may be transferred through the film structure 300 to form the one or more high aspect ratio features 340 using the hardmask layer 322. The high aspect ratio features 340 may be formed using reactive ion etching techniques or other anisotropic etching techniques. In one implementation, plasma or ion beam of etch gas may be directed to the substrate 302 to form the one or more high aspect ratio features 340. The etch gas may include $SF_6$, $C_3F_8CF_4$, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $AsF_6$, $PF_3$, $PF_5$, or combinations thereof.

At operation 270, after formation of the high aspect ratio features 340 in the film structure 300, the hardmask layer 322 may be stripped from the film structure 300 by etching it in an ozone, oxygen, ammonia plasma alone or in combination with fluorinated compounds, nitrogen, or hydrogen plasmas.

In summary, some of the benefits of some of the implementations described herein provide a process for increasing throughput and reducing cost of ownership for three-dimensional stacking of semiconductor chips. Some of the implementations described herein provide the ability to increase the deposition rate of silicon nitride films while reducing the presence of Si—H bonds in the deposited silicon nitride film. Some implementations described herein use precursors, which have existing Si—N bonds with a high bonding energy (e.g., 440 kJ/mol) to provide high deposition rate while providing high-quality silicon nitride films. In some implementations, this is achieved by increasing plasma density/energy through, for example, plasma frequency modulation. In some implementations, higher RF power is used with a reduced flow of dilution gas. The higher RF power has been found by the inventors to dissociate Si—H bonds more effectively. In some implementations, for example, a higher RF frequency (e.g., 27 MHz) is used to achieve higher plasma density and a lower RF frequency (e.g., 2 MHz or 350 kHz) for more plasma energy is used.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method, comprising:
depositing eight or more silicon oxide/silicon nitride containing stacks on a substrate positioned on a substrate support in a processing chamber and in the presence of a vacuum, wherein depositing the eight or more silicon oxide/silicon nitride containing stacks comprises:
  (a) energizing a first process gas into a first plasma;
  (b) depositing a silicon oxide layer over the substrate from the first plasma;
  (c) energizing a second process gas into a second plasma, wherein the second process gas comprises a compound having at least one silicon-nitrogen bond selected from disilylamine, silylamine, tridisilylamine, and aminodisilylamine;
  (d) depositing a silicon nitride layer on the silicon oxide layer from the second plasma; and
  (e) flowing a purge gas into the processing chamber for between about 3 seconds and about 10 seconds; and
repeating (a), (b), (c), (d), and (e) until the eight or more silicon oxide/silicon nitride containing stacks have been deposited on the substrate,
  wherein (e) flowing the purge gas into the processing chamber is performed after (d) depositing the silicon nitride layer on the silicon oxide layer from the second plasma and prior to (a) energizing the first process gas into the first plasma,
  wherein a spacing between a surface of the substrate support and a gas distributor through which the second process gas is delivered to the processing chamber is from about 500 mils to about 1,000 mils, and
  wherein (c) energizing the second process gas into the second plasma comprises generating the second plasma by a dual-frequency RF power source that provides a high-frequency power in a range from about 25 MHz and about 30 MHz and a low-frequency power in a range of from about 10 KHz to about 2 MHz.

2. The method of claim 1, further comprising flowing a second purge gas into the processing chamber after (b) depositing the silicon oxide layer over the substrate from the first plasma and prior to (c) energizing the second process gas into the second plasma.

3. The method of claim 1, wherein the silicon nitride layer has a thickness from about 300 angstroms and about 400 angstroms.

4. The method of claim 1, wherein the eight or more silicon oxide/silicon nitride containing stacks are further processed to form stair-like structures for three-dimensional NAND memory devices.

5. The method of claim 1, wherein the second process gas further comprises a nitrogen-containing gas.

6. The method of claim 5, wherein the second process gas further comprises an inert gas and the inert gas is used as the purge gas.

7. The method of claim 1, wherein the spacing is from about 600 mils to about 800 mils.

8. A method, comprising:
depositing eight or more silicon oxide/silicon nitride containing stacks on a substrate positioned on a substrate support in a processing chamber and in the presence of a vacuum, wherein depositing the eight or more silicon oxide/silicon nitride containing stacks comprises:
(a) energizing a first process gas into a first plasma, wherein the first plasma is generated by an RF power source at a low-frequency between 0.3 MHz and about 14 MHz;
(b) depositing a silicon oxide layer over the substrate from the first plasma;
(c) energizing a second process gas into a second plasma, wherein the second process gas comprises a compound having at least one silicon-nitrogen bond;
(d) depositing a silicon nitride layer on the silicon oxide layer from the second plasma; and
(e) flowing a purge gas into the processing chamber for between about 3 seconds and about 10 seconds; and
repeating (a), (b), (c), (d), and (e) until the eight or more silicon oxide/silicon nitride containing stacks have been deposited on the substrate,
wherein the compound having the at least one silicon-nitrogen bond is selected from disilylamine, silylamine, tridisilylamine, and am inodisilylamine,
wherein (e) flowing the purge gas into the processing chamber is performed after (d) depositing the silicon nitride layer on the silicon oxide layer from the second plasma and prior to (a) energizing the first process gas into the first plasma
wherein a spacing between a surface of the substrate support and a gas distributor through which the second process gas is delivered to the processing chamber is from about 500 mils to about 1,000 mils, and
wherein (c) energizing the second process gas into the second plasma comprises generating the second plasma by a dual-frequency RF power source that provides a high-frequency power in a range from about 25 MHz and about 30 MHz and a low-frequency power in a range of from about 10 KHz to about 2 MHz.

9. The method of claim 8, further comprising flowing a second purge gas into the processing chamber after (b) depositing the silicon oxide layer over the substrate from the first plasma and prior to (c) energizing the second process gas into the second plasma.

10. The method of claim 8, wherein the high-frequency power is about 27 MHz.

11. The method of claim 8, wherein the eight or more silicon oxide/silicon nitride containing stacks are further processed to form stair-like structures for three-dimensional NAND memory devices.

12. The method of claim 8, wherein the second process gas further comprises a nitrogen-containing gas.

13. The method of claim 12, wherein the second process gas further comprises an inert gas and the inert gas is used as the purge gas.

14. The method of claim 8, wherein the spacing is from about 600 mils to about 800 mils.

15. A method, comprising:
depositing eight or more silicon oxide/silicon nitride containing stacks on a substrate positioned on a substrate support in a processing chamber and in the presence of a vacuum, wherein depositing the eight or more silicon oxide/silicon nitride containing stacks comprises:
(a) energizing a first process gas into a first plasma, wherein the first plasma is generated by an RF power source at a low-frequency between 0.3 MHz and about 14 MHz;
(b) depositing a silicon oxide layer over the substrate from the first plasma;
(c) energizing a second process gas into a second plasma, wherein the second process gas comprises nitrogen ($N_2$), ammonia ($NH_3$), argon, and a compound having at least one silicon-nitrogen bond and the second plasma is generated by a dual-frequency RF power source that provides a high-frequency power in a range from about 25 MHz and about 30 MHz and a low-frequency power in a range of from about 10 KHz to about 2 MHz;
(d) depositing a silicon nitride layer on the silicon oxide layer from the second plasma; and
(e) flowing a purge gas into the processing chamber for between about 3 seconds and about 10 seconds; and
repeating (a), (b), (c), (d), and (e) until the eight or more silicon oxide/silicon nitride containing stacks have been deposited on the substrate,
wherein the compound having the at least one silicon-nitrogen bond is selected from disilylamine, silylamine, tridisilylamine, and am inodisilylamine,
wherein (e) flowing the purge gas into the processing chamber after (d) depositing the silicon nitride layer on the silicon oxide layer from the second plasma and prior to (a) energizing the first process gas into the first plasma, and
wherein a spacing between a surface of the substrate support and a gas distributor through which the second process gas is delivered to the processing chamber is from about 500 mils to about 1,000 mils.

16. The method of claim 15, further comprising flowing a second purge gas into the processing chamber after (b) depositing the silicon oxide layer over the substrate from the first plasma and prior to (c) energizing the second process gas into the second plasma.

17. The method of claim 15, wherein the eight or more silicon oxide/silicon nitride containing stacks are further processed to form stair-like structures for three-dimensional NAND memory devices.

18. The method of claim 15, wherein the second process gas further comprises a nitrogen-containing gas.

19. The method of claim 18, wherein the second process gas further comprises an inert gas and the inert gas is used as the purge gas.

20. The method of claim 15, wherein the spacing is from about 600 mils to about 800 mils.

* * * * *

UNITED STATES PATENT AND TRADEMARK OFFICE
CERTIFICATE OF CORRECTION

PATENT NO. : 10,790,140 B2
APPLICATION NO. : 15/889744
DATED : September 29, 2020
INVENTOR(S) : Xinhai Han et al.

Page 1 of 1

It is certified that error appears in the above-identified patent and that said Letters Patent is hereby corrected as shown below:

In the Specification

In Column 13, Line 41, delete "$C_3F_8CF_4$," and insert -- $C_3F_8$, $CF_4$, --, therefor.

In the Claims

In Column 15, Line 33, in Claim 8, delete "am inodisilylamine," and insert -- aminodisilylamine, --, therefor.

In Column 16, Line 37, in Claim 15, delete "am inodisilylamine," and insert -- aminodisilylamine, --, therefor.

Signed and Sealed this
Tenth Day of November, 2020

Andrei Iancu
*Director of the United States Patent and Trademark Office*